United States Patent
Song et al.

(10) Patent No.: US 11,984,421 B2
(45) Date of Patent: May 14, 2024

(54) INTEGRATED CIRCUIT CHIP HAVING BS-PDN STRUCTURE

(71) Applicant: SAMSUNG ELECTRONICS CO., LTD., Suwon-si (KR)

(72) Inventors: Eunseok Song, Hwaseong-si (KR); Hongjoo Baek, Seongnam-si (KR); Kyungsuk Oh, Seongnam-si (KR); Manho Lee, Hwaseong-si (KR); Hyuekjae Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 288 days.

(21) Appl. No.: 17/228,111

(22) Filed: Apr. 12, 2021

(65) Prior Publication Data

US 2022/0139863 A1   May 5, 2022

(30) Foreign Application Priority Data

Nov. 3, 2020   (KR) .................. 10-2020-0145241

(51) Int. Cl.
| | |
|---|---|
| *H01L 23/00* | (2006.01) |
| *H01L 23/31* | (2006.01) |
| *H01L 23/48* | (2006.01) |
| *H01L 23/528* | (2006.01) |

(52) U.S. Cl.
CPC .......... *H01L 24/24* (2013.01); *H01L 23/3157* (2013.01); *H01L 23/481* (2013.01); *H01L 23/5286* (2013.01); *H01L 2224/24265* (2013.01); *H01L 2924/19041* (2013.01)

(58) Field of Classification Search
CPC . H01L 2224/24265; H01L 2924/19041; H01L 2924/191–19104; H01L 24/24; H01L 23/3157; H01L 23/481; H01L 23/5286
See application file for complete search history.

(56) References Cited

U.S. PATENT DOCUMENTS

| | | | |
|---|---|---|---|
| 6,495,454 | B2 | 12/2002 | Livengood et al. |
| 9,331,062 | B1 | 5/2016 | Lane et al. |
| 9,496,211 | B2 | 11/2016 | Kulkarni et al. |
| 9,559,040 | B2 | 1/2017 | Batra et al. |
| 10,510,737 | B2 | 12/2019 | Kim et al. |
| 10,636,739 | B2 | 4/2020 | Beyne et al. |
| 10,720,401 | B2 | 7/2020 | Ting et al. |
| 2002/0020862 | A1 | 2/2002 | Livengood et al. |
| 2014/0138845 | A1 | 5/2014 | Kulkarni et al. |

(Continued)

FOREIGN PATENT DOCUMENTS

EP   3324436 A   5/2018

*Primary Examiner* — Laura M Menz
*Assistant Examiner* — Candice Chan
(74) *Attorney, Agent, or Firm* — Sughrue Mion, PLLC (57) ABSTRACT

An integrated circuit chip includes a substrate having an active surface and a back surface opposite to the active surface; a front-end-of-line (FEOL) structure disposed on the active surface of the substrate; a first back-end-of-line (BEOL) structure disposed on the FEOL structure; an intermediate connection layer disposed under the back surface of the substrate, the intermediate connection layer including a charge storage, and metal posts disposed around the charge storage; and a re-distribution structure layer disposed under the intermediate connection layer.

20 Claims, 11 Drawing Sheets

(56) References Cited

U.S. PATENT DOCUMENTS

| | | |
|---|---|---|
| 2015/0187642 A1 | 7/2015 | Batra et al. |
| 2018/0145030 A1* | 5/2018 | Beyne ................. H01L 23/5283 |
| 2018/0301443 A1 | 10/2018 | Kim et al. |
| 2020/0027851 A1 | 1/2020 | Ting et al. |
| 2020/0203276 A1 | 6/2020 | Hiblot et al. |
| 2021/0407942 A1* | 12/2021 | Yu ........................... H01L 25/03 |

* cited by examiner

INTEGRATED CIRCUIT CHIP HAVING BS-PDN STRUCTURE

CROSS-REFERENCE TO THE RELATED APPLICATION

This application claims priority from Korean Patent Application No. 10-2020-0145241, filed on Nov. 3, 2020, in the Korean Intellectual Property Office, the disclosure of which is incorporated herein by reference in its entirety.

BACKGROUND

1. Field

Non-limiting example embodiments of the disclosure relate to an integrated circuit chip. Particularly, non-limiting example embodiments of the disclosure relate to an integrated circuit chip in which a power distribution network is disposed under a substrate.

2. Description of Related Art

Recently, research into a semiconductor process for manufacture of an integrated circuit chip has been conducted in order to achieve an increase in device density. When a down-scaling process is used in a semiconductor process, there is an advantage in that the size of a line or a via in an on-chip back-end-of-line (BEOL) structure is reduced, whereas there is a disadvantage in that the resistance of the line or the via increases.

In order to overcome such a disadvantage, in conventional cases, an on-chip interconnection and a power line are simultaneously designed in an on-chip BEOL structure and, as such, power may be stably supplied to a logic chip.

In addition, in conventional cases, BEOL structures for supply of signals are additionally disposed at one side of a substrate where a transistor is disposed and at the other side of the substrate, respectively, and, as such, power may be stably supplied to the logic chip.

SUMMARY

Non-limiting example embodiments of the disclosure provide an integrated circuit chip capable of minimizing a power delivery path, along which power is delivered.

Non-limiting example embodiments of the disclosure provide an integrated circuit chip which can be inexpensively manufactured.

According to one or more embodiments of the present disclosure, an integrated circuit chip is provided. The integrated circuit chip includes: a substrate having an active surface and a back surface opposite to the active surface; a front-end-of-line (FEOL) structure disposed on the active surface of the substrate; a first back-end-of-line (BEOL) structure disposed on the FEOL structure; an intermediate connection layer disposed under the back surface of the substrate, the intermediate connection layer including a charge storage, and metal posts disposed around the charge storage; and a re-distribution structure layer disposed under the intermediate connection layer.

According to one or more embodiments of the present disclosure, an integrated circuit chip is provided. The integrated circuit chip includes: a logic chip; and a power distribution network (PDN) disposed under the logic chip. The logic chip includes: a substrate having an active surface and a back surface opposite to the active surface, a front-end-of-line (FEOL) structure disposed on the active surface of the substrate and including a lower insulating film including an oxide, the FEOL structure constituting a logic cell including a fin field effect transistor (FinFET), and a first back-end-of-line (BEOL) structure disposed on the FEOL structure. The PDN includes: a second BEOL structure disposed under the substrate and having a smaller thickness than the first BEOL structure, an intermediate connection layer disposed under the second BEOL structure, the intermediate connection layer including a charge storage, copper (Cu) posts disposed around the charge storage, and a molding material covering side surfaces of the charge storage and the copper posts, the charge storage including SI, a re-distribution structure layer disposed under the intermediate connection layer, and solder balls disposed under the re-distribution structure layer.

According to one or more embodiments of the present disclosure, an integrated circuit chip is provided. The integrated circuit chip includes: a logic chip including a substrate and a fin field effect transistor (FinFET) on one surface of the substrate; and a power distribution network (PDN) disposed under the logic chip. The PDN includes: a back-end-of-line (BEOL) structure disposed under the substrate, an intermediate connection layer disposed under the BEOL structure, the intermediate connection layer including a charge storage, copper (Cu) posts disposed around the charge storage, and a molding material covering side surfaces of the charge storage and the copper posts, the charge storage including Si, and a re-distribution structure layer disposed under the intermediate connection layer.

According to one or more embodiments of the present disclosure, an integrated circuit chip is provided. The integrated circuit chip includes: a substrate having an active surface and a back surface opposite to the active surface; a front-end-of-line (FEOL) structure disposed on the active surface of the substrate; a first back-end-of-line (BEOL) structure disposed on the FEOL structure, the first BEOL structure including a plurality of wiring layers patterned in a horizontal direction; a second BEOL structure disposed under the back surface of the substrate, the second BEOL structure including a single-layer wiring patterned in the horizontal direction; an intermediate connection layer disposed under the second BEOL structure, the intermediate connection layer including a charge storage, copper (Cu) posts disposed around the charge storage, and a molding material covering side surfaces of the charge storage and the copper posts, the charge storage including Si; a re-distribution structure layer disposed under the intermediate connection layer; and solder balls disposed under the re-distribution structure layer.

According to embodiments of the present disclosure, the integrated circuit chip can secure PI (power integrity) characteristics and can be manufactured at low cost.

DETAILED DESCRIPTION

It will be understood that when an element, component, layer, pattern, structure, region, or so on (hereinafter collectively "element") of a semiconductor device is referred to as being "over," "above," "on," "below," "under," "beneath," "connected to", or "coupled to" another element of the semiconductor device, it can be directly over, above, on, below, under, beneath, connected, or coupled to the other element or an intervening element(s) may be present. In contrast, when an element of a semiconductor device is referred to as being "directly over," "directly above," "directly on," "directly below," "directly under," "directly beneath," "directly connected to", or "directly coupled to" another element of the semiconductor device, there are no intervening elements present. Like numerals refer to like elements throughout this disclosure.

Figure 1:
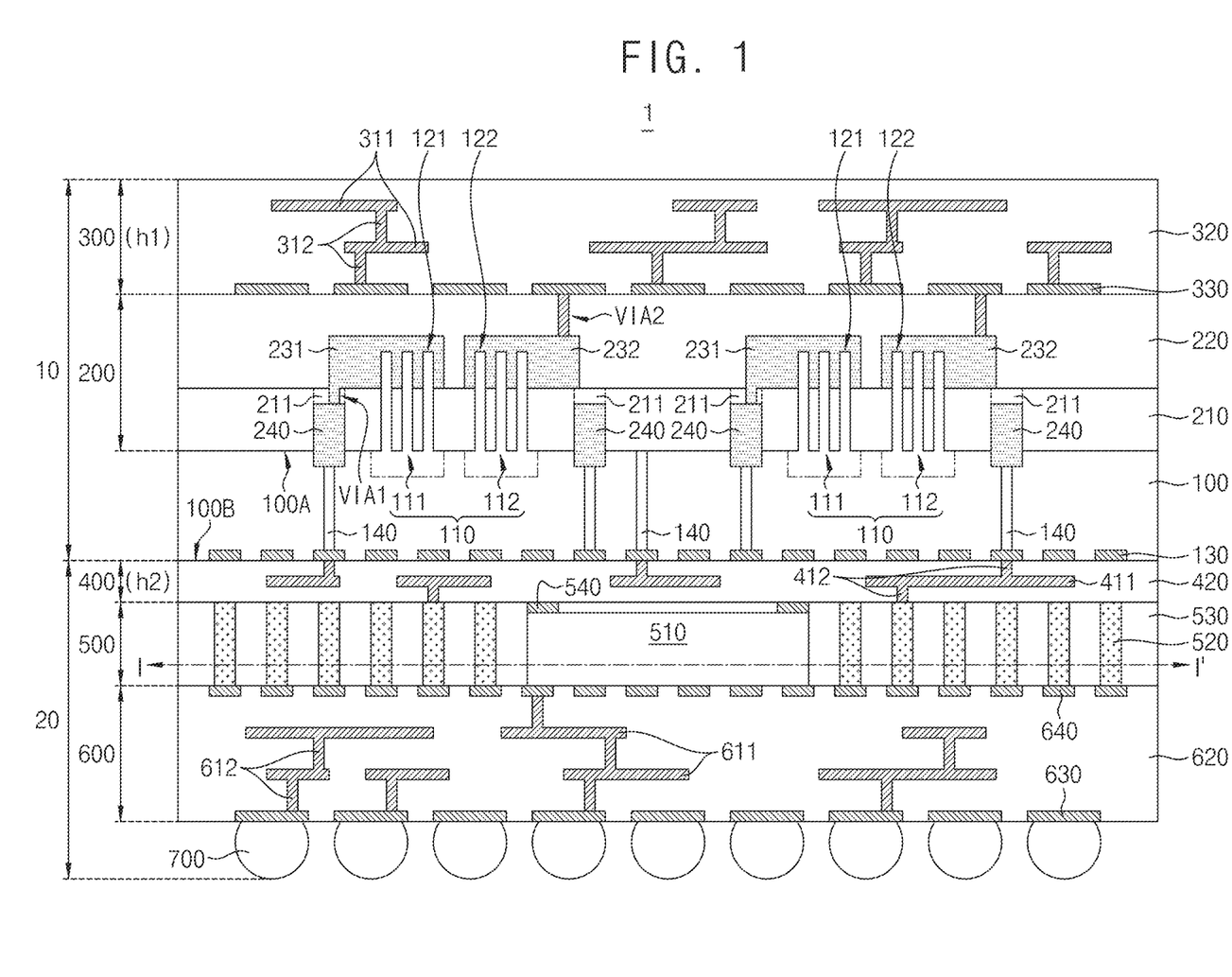
FIG. 1 is a sectional view of an integrated circuit chip according to an example embodiment of the disclosure.
Figure 2:
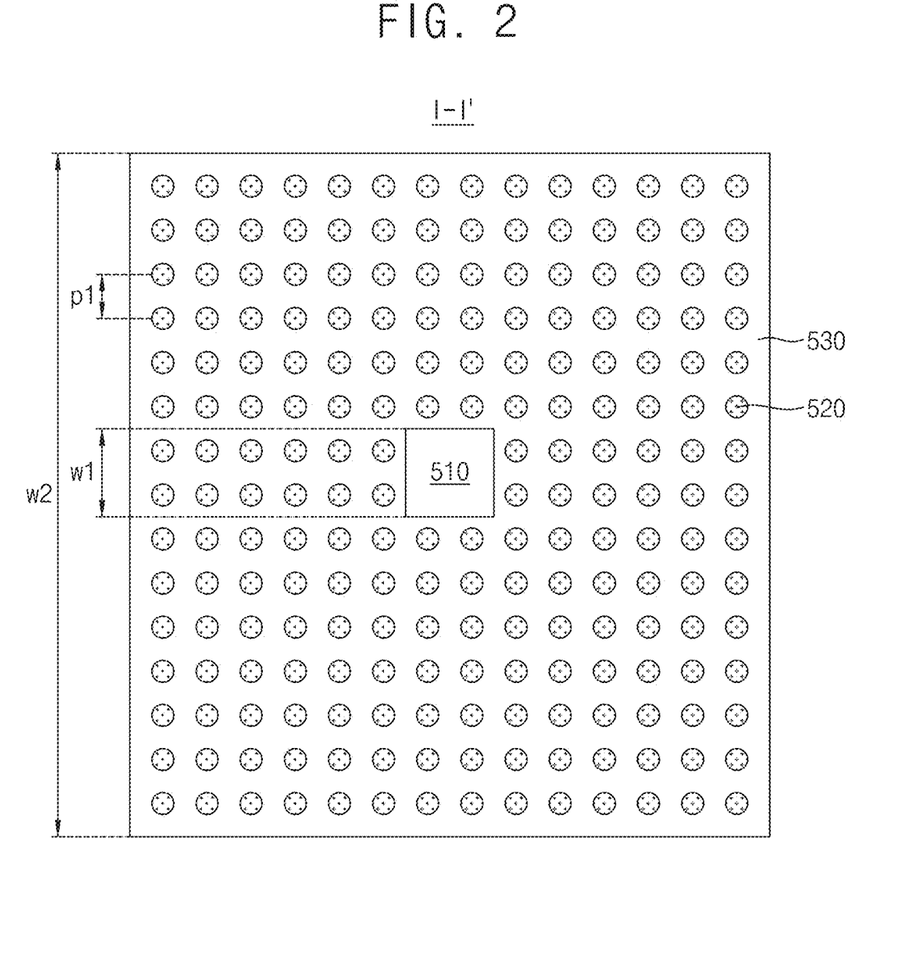
FIG. 2 is a plan view of a portion of FIG. 1 taken along line I-I' in FIG. 1.
Figure 3:
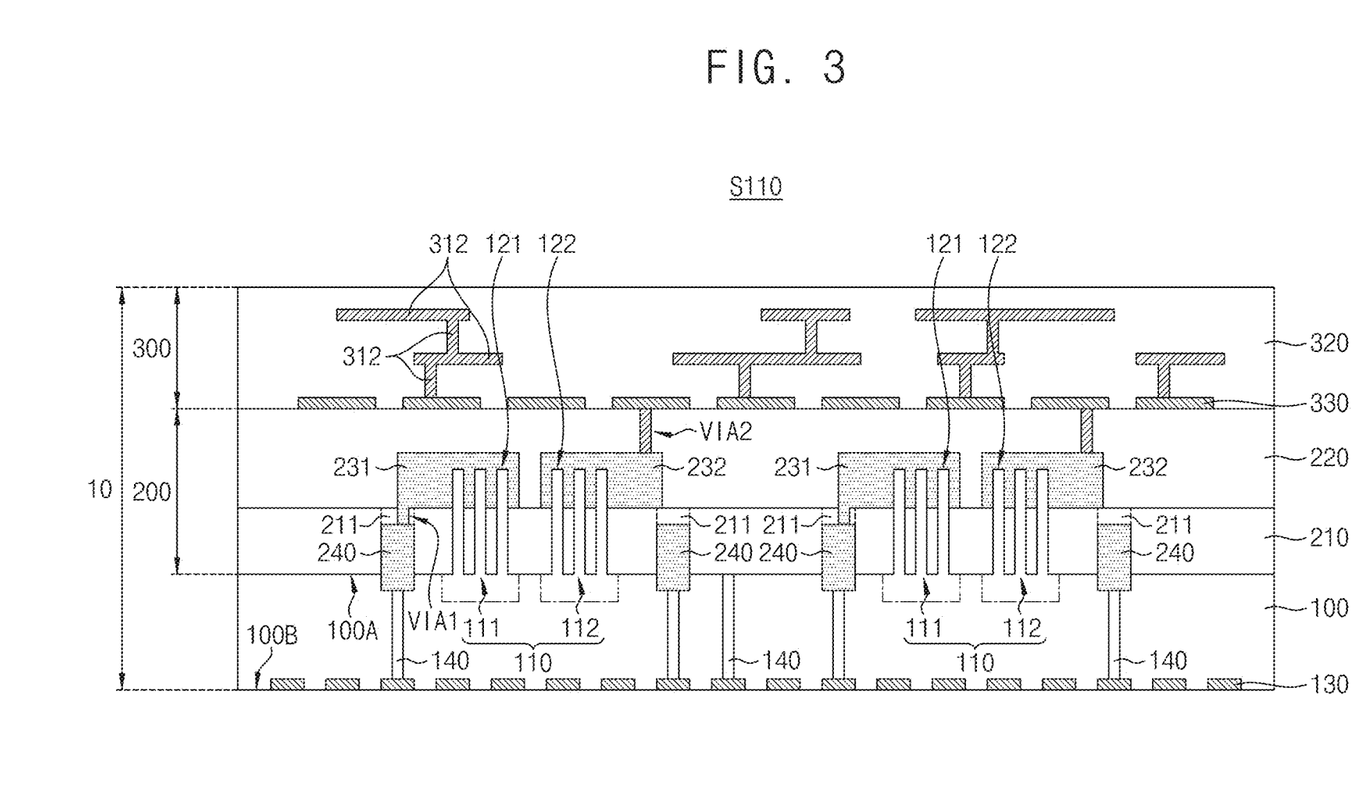
FIG. 3 is a first sectional view showing a method for manufacturing an integrated circuit chip in accordance with an example embodiment of the disclosure.
Figure 4:
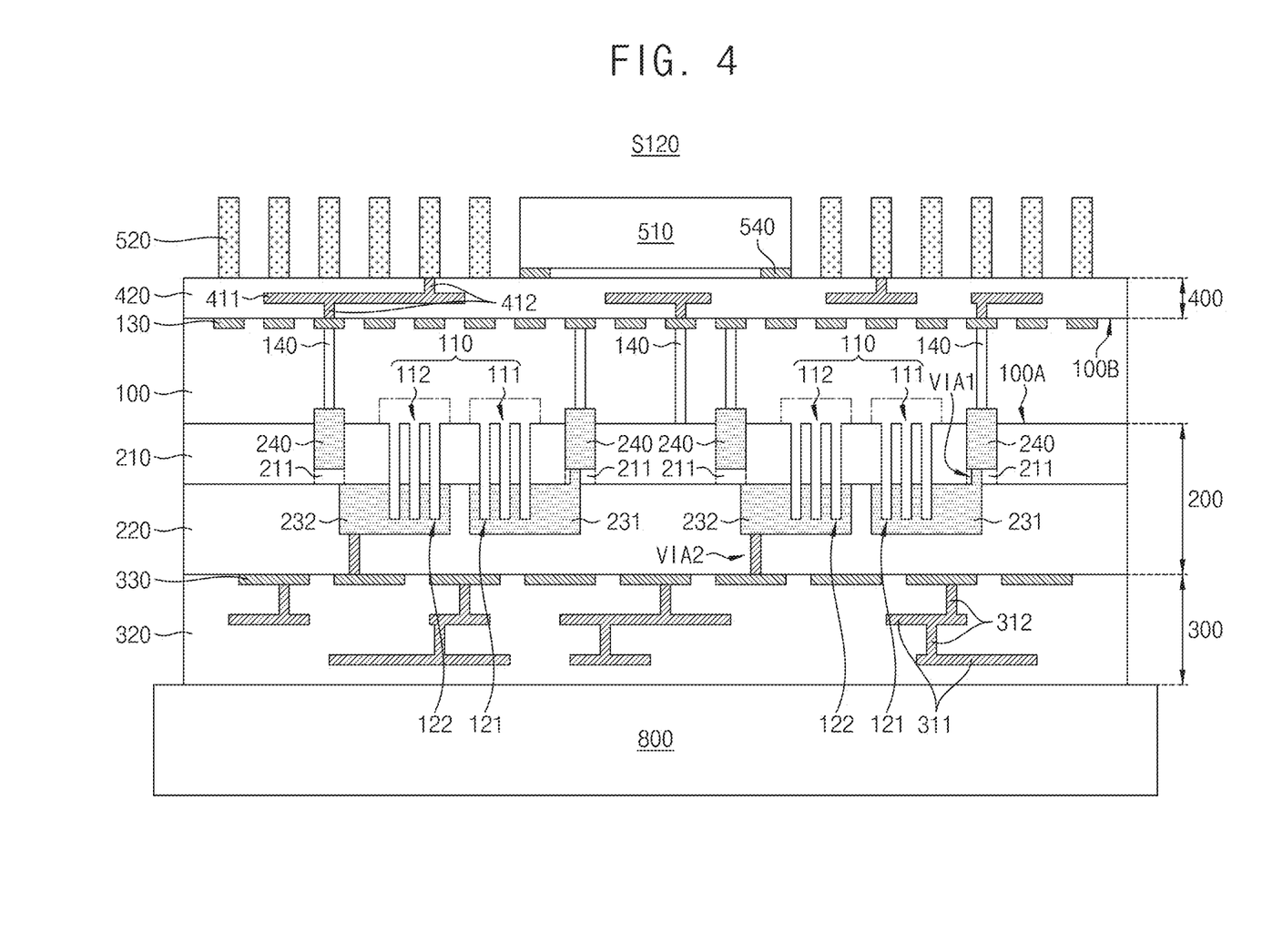
FIG. 4 is a second sectional view showing the method for manufacturing the integrated circuit chip in accordance with the example embodiment of the disclosure.

FIG. 1 is a sectional view of an integrated circuit chip according to an example embodiment of the disclosure. FIG. 2 is a plan view of a portion of FIG. 1 taken along line I-I' in FIG. 1.

Referring to FIGS. 1 and 2, in an embodiment, an integrated circuit chip 1 may have a backside power distribution network (BS-PDN) structure. The integrated circuit chip 1 includes a logic chip 10, and a power distribution network (PDN) 20 disposed under the logic chip 10. The logic chip 10 may receive operation current and an operation voltage through the PDN 20.

In an embodiment, the logic chip 10 may include a substrate 100 having an active surface 100A and a back surface 100B, which are opposite surfaces, a front-end-of-line (FEOL) structure 200 formed on the active surface 100A of the substrate 100, and a first back-end-of line (BEOL) structure 300 formed on the FEOL structure 200.

In an embodiment, the PDN 20 may include a second BEOL structure 400 formed under the back surface 100B of the substrate 100, an intermediate connection layer 500 formed under the second BEOL structure 400, a re-distribution structure layer 600 formed under the intermediate connection layer 500, and a plurality of solder balls 700 formed under the re-distribution structure layer 600.

In an embodiment, the integrated circuit chip 1 includes an integrated circuit. In some embodiments, the integrated circuit may be applied to memory chips such as volatile memory (for example, DRAM), non-volatile memory (for example, ROM), flash memory, etc. application processor chips such as a central processor (for example, a CPU), a graphics processor (for example, a GPU), a digital signal processor, a crypto-processor, a microprocessor, a microcontroller, etc., and logic chips such as an analog-digital converter, an application-specific integrated circuit (ASIC), etc. The integrated circuit may also be applied to a power management chip such as a power management integrated circuit (PMIC).

In an embodiment, the integrated circuit chip 1 may have a quadrangular shape when viewed in a plane.

The substrate 100 may include one or more semiconductor materials. For example, the semiconductor materials may be Si, Ge, SiGe, GaP, GaAs, SiC, SiGeC, and/or InP. In some embodiments, the substrate 100 may be a bulk substrate (for example, a bulk silicon substrate) or a semiconductor-on-insulator (SOI) substrate.

The substrate 100 may include a channel region 110 protruding upwards from the active surface 100A. For example, the channel region 110 may protrude from the substrate 100 in a vertical direction that may be perpendicular to the active surface 100A.

The FEOL structure 200 may be disposed on the active surface 100A of the substrate 100. The FEOL structure 200 may be formed through an FEOL process. The FEOL process may refer to a process for forming individual elements, for example, a transistor, a capacitor, a resistor, etc., on the substrate 100 in a manufacturing procedure for the integrated circuit chip 1. For example, the FEOL process may include planarization and cleaning of a wafer, formation of a trench, formation of a well, formation of a gate line, formation of a source and drain, etc.

The FEOL structure 200 may constitute a logic cell including a fin field effect transistor (FinFET). Of course, the FEOL structure 200 is not limited to the above-described condition, and may constitute a logic cell including a metal-oxide-semiconductor field effect transistor (MOSFET), a system large scale integration (LSI), a microelectromechanical system (MEMS), an active device, or a passive device which include a plurality of transistors.

In some embodiments, the integrated circuit chip 1 may further include a lower insulating film 210 disposed on the active surface 100A of the substrate 100. The lower insulating film 210 may extend to have a predetermined thickness on opposite side surfaces of the channel region 110 and the active surface 100A of the substrate 100. The lower insulating film 210 may be disposed only at lower portions of the opposite side surfaces of the channel region 110. The lower insulating film 210 may include an insulating material. For example, the lower insulating film 210 may include silicon oxide, silicon nitride and/or silicon oxynitride.

The protrusion height of the channel region 110 may be greater than the thickness of the lower insulating film 210. That is, the channel region 110 may have a shape protruding from the lower insulating film 210 while extending through the lower insulating film 210.

The channel region 110 may include, for example, a well doped with a dopant or a conductive region doped with a dopant. For example, the conductive region may include a first doped region 111 and a second doped region 112. In an embodiment, the first doped region 111 may be an n-type doped region, whereas the second doped region 112 may be a p-type doped region.

The first doped region 111 may include a plurality of first fin-type active regions 121 protruding vertically, whereas the second doped region 112 may include a plurality of second fin-type active regions 122 protruding vertically.

The integrated circuit chip 1 may further include a source region 231 and a drain region 232 which are disposed on the channel region 110 while being isolated from each other.

The source region 231 and the drain region 232 may be disposed on the lower insulating film 210. In an embodiment, the source region 231 and the drain region 232 may contact an upper portion of the channel region 110. For example, the source region 231 may contact one of the first fin-type active region 121 and the second fin-type active region 122, whereas the drain region 232 may contact the other of the first fin-type active region 121 and the second fin-type active region 122. The source region 231 and the drain region 232 may vertically overlap with the channel region 110. In some embodiments, the source region 231 and the drain region 232 may be disposed on ends of the channel region 110, respectively. The source region 231 and the drain region 232 may include a semiconductor material and/or dopant atoms (for example, B, P or As atoms).

The integrated circuit chip 1 may further include an interconnection 240 formed to extend vertically through the substrate 100 and the lower insulating film 210. The interconnection 240 may be formed at a side portion of the channel region 110, and may be formed under the source region 231 and the drain region 232. The interconnection 240 may be used to deliver a signal between devices or to provide a power supply rail and/or a ground rail. In some example embodiments, the interconnection 240 functions as one or more source/drain contact rails on a metal layer or an interconnection line laid on a FinFET circuit. The interconnection 240 may contact one of the source region 231 and the drain region 232. In some embodiments, the interconnection 240 may provide additional routing resources (in addition to the metal layer or the interconnection line laid on the FinFET circuit) and, as such, may be used to achieve a reduction in circuit area, an increase in circuit density, and an alleviation in routing congestion.

The integrated circuit chip 1 may further include a dielectric capping layer 211 covering an upper portion of the interconnection 240. The dielectric capping layer 211 may cover an upper end of the interconnection 240. The interconnection 240 may contact at least one of the source region 231 and the drain region 232 through a first via VIA1 extending through the dielectric capping layer 211.

The integrated circuit chip 1 may further include an insulating capping layer 220 disposed on the lower insulating film 210 while covering the source region 231 and the drain region 232. In some embodiments, an upper surface of the insulating capping layer 220 may be flat. For example, the insulating capping layer 220 may be constituted by a silicon nitride film.

The integrated circuit chip 1 may include second vias VIA2 extending through the insulating capping layer 220. At least a part of the second vias VIA2 may contact the source region 231 or the drain region 232. The second vias VIA2 may be electrically connected to first BEOL pads 330 in the first BEOL structure 300, which will be described later.

A structure (for example, the lower insulating film 210), disposed above the active surface 100A of the substrate 100, and the insulating capping layer 220 may be referred to as the FEOL structure 200.

The integrated circuit chip 1 may further include substrate pads 130 disposed under the substrate 100. The substrate pads 130 may be exposed at the back surface 100B of the substrate 100. The substrate pads 130 may include a conductive material (for example, a metal).

The integrated circuit chip 1 may further include nanoscopic through-silicon vias (TSVs) extending vertically through the substrate 100. At least a part of the nanoscopic TSVs 140 may electrically connect the interconnection 240 and one of the substrate pads 130 corresponding to the interconnection 240. Each nanoscopic TSV 140 may be formed to have a diameter (width) of 1 µm or less. In an embodiment, the diameter (width) of each nanoscopic TSV 140 may be about 50 to 200 nm.

The first BEOL structure 300 may be disposed on the FEOL structure 200. The first BEOL structure 300 may be formed through a BEOL process (including a second BEOL process to be described later). The BEOL process may be referred to a process for interconnecting individual elements, for example, a transistor, a capacitor, a resistor, etc., in the manufacturing procedure for the integrated circuit chip 1. For example, the BEOL process may include silicidation of a region where a gate is formed (not shown), the source region 231 and the drain region 232, addition of dielectrics, planarization, formation of a hole, addition of a metal layer, formation of a contact plug, formation of a passivation layer, etc. For example, the integrated circuit chip 1 may be packaged in a semiconductor package after execution of the BEOL process and, as such, may be used as an element for various applications.

The first BEOL structure 300 may include a plurality of multilayer wiring structures electrically connected to the FEOL structure 200, and a first interlayer insulating film 320 for inter-insulating a part of the plurality of multilayer wiring structures. The first interlayer insulating film 320 may be formed to cover the FEOL structure 200. In addition, the first BEOL structure 300 may include the first BEOL pads 330 exposed at a bottom of the first BEOL structure 300. The first BEOL pads 330 may electrically connect corresponding ones of elements of the FEOL structure 200 and the multilayer wiring structures.

Each of the plurality of multilayer wiring structures may include a plurality of wiring layers 311, and a plurality of first contact plugs 312 each interconnecting adjacent ones of the plurality of wiring layers 311 between the adjacent wiring layers 311. Each of the wiring layers 311 may be horizontally patterned. The first contact plugs 312 may be vertically formed.

In accordance with an embodiment, each of the wiring layers 311 and the first contact plugs 312 may include a metal layer and a conductive barrier film (not shown) surrounding a surface of the metal layer. The metal layer is made of Cu, W, Ta, Ti, Co, Mn, Al, or a combination thereof. The conductive barrier film may be made of Ta, Ti, TaN, TiN, AlN, WN, or a combination thereof. The number of the plurality of wiring layers 311 vertically stacked in each of the multilayer wiring structures in a sequential manner may be variously selected without being particularly limited. The first interlayer insulating film 320 may be constituted by a silicon oxide film, a silicon nitride film, a silicon oxynitride film, or a combination thereof. In accordance with an embodiment, an uppermost layer constituting the first interlayer insulating film 320 may be a passivation layer.

The second BEOL structure 400 may be disposed under the substrate 100 (that is, on the back surface 100B of the substrate 100). A thickness h2 of the second BEOL structure 400 may be smaller than a thickness h1 of the first BEOL structure 300. The second BEOL structure 400 may include a single-layer wiring 411 electrically connected to the substrate 100 and the intermediate connection layer 500; a plurality of second contact plugs 412 interconnecting the single-layer wiring 411, the substrate 100, and the intermediate connection layer 500; and a second interlayer insulating layer 420 covering upper and lower portions of the single-layer wiring 411. The single-layer wiring 411 may be horizontally patterned. The second contact plugs 412 may be vertically formed.

In accordance with an embodiment, each of the single-layer wiring 411 and the second contact plugs 412 may include a metal layer, and a conductive barrier film (not shown) surrounding a surface of the metal layer. The metal layer and the conductive barrier film in the second BEOL structure 400 may include materials illustratively described in conjunction with the first BEOL structure 300.

The intermediate connection layer 500 may be disposed under the second BEOL structure 400.

The intermediate connection layer 500 may include a charge storage member 510 (e.g. a charge storage), metal posts 520 disposed around the charge storage member 510, and a molding material 530 covering side surfaces of the charge storage member 510 and the metal posts 520.

The intermediate connection layer 500 may have a structure in which a capacitor is embedded.

The charge storage member 510 may be disposed inside the intermediate connection layer 500 when viewed in a plane. For example, the charge storage member 510 may be disposed at a center of the integrated circuit chip 1 when viewed in a plane. In an embodiment, the charge storage member 510 may have a quadrangular shape when viewed in a plane. In an embodiment, when viewed in a plane, a length w1 of one side of the charge storage member 510 may be about 5 to 20% of a length w2 of one side of the integrated circuit chip 1 (the molding material 530 or the substrate 100).

The charge storage member 510 may include a capacitor function. That is, the charge storage member 510 may store charges. In an embodiment, the charge storage member 510 may have a charge storage capacity of about 200 to 400 $nF/mm^2$. For example, the charge storage member 510 may include a semiconductor material. For example, the semiconductor material may include Si.

The metal posts 520 may be disposed around the charge storage member 510. In an embodiment, the metal posts 520 may have a cylindrical shape. Correspondingly, the cross-section of each metal post 520 may have a circular shape.

In an embodiment, the height of each metal post 520 may be greater than the height of the charge storage member 510. According to embodiments, each metal post 520 may have a small height. For example, each metal post 520 may have a height of about 10 to 20 μm. In another example, each metal post 520 may have a height of about 5 μm.

In an embodiment, the metal posts 520 may be arranged to have a pitch p1 of about 100 to 120 μm. For example, one integrated circuit chip 1 may include about 6,000 or more metal posts 520.

The metal posts 520 may electrically connect the second BEOL structure 400 and the re-distribution structure layer 600. In addition, the metal posts 520 may electrically connect the substrate 100 and the re-distribution structure layer 600. For example, the metal posts 520 may include a metal material. For example, each metal post 520 may be a copper (Cu) post made of copper (Cu).

The intermediate connection layer 500 may further include at least one connection pad 540 directly disposed on the charge storage member 510. The connection pad 540 may electrically connect the charge storage member 510 to the second BEOL structure 400. At least one connection pad 540 may be disposed on the charge storage member 510. In an embodiment, the sum of the height of the connection pad 540 and the height of the charge storage member 510 may be substantially equal to the height of each metal post 520. The connection pad 540 may include a conductive material (for example, a metal).

The molding material 530 may cover side surfaces of the metal posts 520, the connection pad 540, and the charge storage member 510. In accordance with an embodiment, the molding material 530 may further cover at least a portion of an upper surface of the charge storage member 510 (for example, a region where the connection pad 540 is not disposed). For example, the molding material 530 may include a thermosetting resin. For example, the molding material 530 may include an epoxy molding compound (EMC).

The re-distribution structure layer 600 may be disposed under the intermediate connection layer 500.

The re-distribution structure layer 600 may include first re-distribution pads 640 disposed at an upper side, second re-distribution pads 630 disposed at a lower side, and a plurality of wiring layers 611 each electrically connecting corresponding ones of the first re-distribution pads 640 and the second re-distribution pads 630. In an embodiment, the plurality of wiring layers 611 may include a first wiring layer and a second wiring layer.

The re-distribution structure layer 600 may include re-distribution vias 612 each vertically connecting corresponding ones of the first re-distribution pads 640, the second re-distribution pads 630, and the wiring layers 611, which are disposed at different layers. The wiring layers 611 and the re-distribution vias 612 may include a conductive material such as copper (Cu), aluminum (Al), silver (Ag), tin (Sn), gold (Au), nickel (Ni), lead (Pb), titanium (Ti), an alloy thereof, or the like.

The re-distribution structure layer 600 may include third interlayer insulating films 620 each covering upper and lower portions of a corresponding one of the wiring layers 611. An uppermost one of the third interlayer insulating films 620 may be a passivation layer. The third interlayer insulating films 620 may include a selected one of $SiO_2$, $Si_3N_4$, SiON, $Ta_2O_5$, $HfO_2$, polyimide (PI), polybenzoxazole (PBO), benzocyclobutene (BCB) or bismaleimide-triazine (BT) and a photosensitive resin.

The re-distribution structure layer 600 may perform various functions in accordance with given designs. For example, each of the plurality of wiring layers 611 of the re-distribution structure layer 600 may include a ground pattern, a power pattern, a signal pattern, etc. A lower surface of the re-distribution structure layer 600 may be disposed at substantially the same level as a lower surface of the integrated circuit chip 1. That is, the lower surface of the re-distribution structure layer 600 may be coplanar with the lower surface of the integrated circuit chip 1.

The solder balls 700 may be disposed under the re-distribution structure layer 600. Each of the solder balls 700 may be electrically connected to a corresponding one of the plurality of wiring layers 611, the re-distribution vias 612, or the second re-distribution pads 630 of the re-distribution structure layer 600. In an embodiment, the solder balls 700 may contact the second re-distribution pads 630, respectively. For example, the solder balls 700 may include chromium/chromium-copper alloy/copper (Cr/Cr-Cu/Cu), titanium-tungsten alloy/copper (Ti—W/Cu), aluminum/nickel/copper (Al/Ni/Cu), or nickel. The solder balls 700 may be formed through sputtering, electroplating, or electroless plating.

In accordance with an embodiment, the second re-distribution pads 630 may be omitted from the re-distribution structure layer 600 and, as such, corresponding ones of the re-distribution vias 612 and the solder balls 700 may be directly connected.

FIGS. 3 to 7 are sectional views showing a method for manufacturing an integrated circuit chip in accordance with an example embodiment of the disclosure.

Referring to FIGS. 3 to 7, first, a logic chip 10 may be formed (cf. S110). An FEOL structure 200 and a first BEOL structure 300 may be sequentially formed on an active surface 100A of a substrate 100.

Thereafter, a second BEOL structure 400 may be formed under the substrate 100, and a charge storage member 510 and metal posts 520 may be formed under the second BEOL structure 400 (cf. S120). In detail, the logic chip 10 may be disposed on a carrier 800 in an inverted state. That is, the logic chip 10 may be inverted, and may then be disposed on the carrier 800 such that the first BEOL structure 300 is disposed adjacent to the carrier 800. Subsequently, when viewed in FIG. 4, a second BEOL structure 400 may be formed on a back surface 100B of the substrate 100, and the charge storage member 510 and the metal posts 520 may be formed on the second BEOL structure 400. Formation of the metal posts 520 may be achieved in such a manner that the metal posts 520 are formed in a fan-out semiconductor package.

Figure 5:
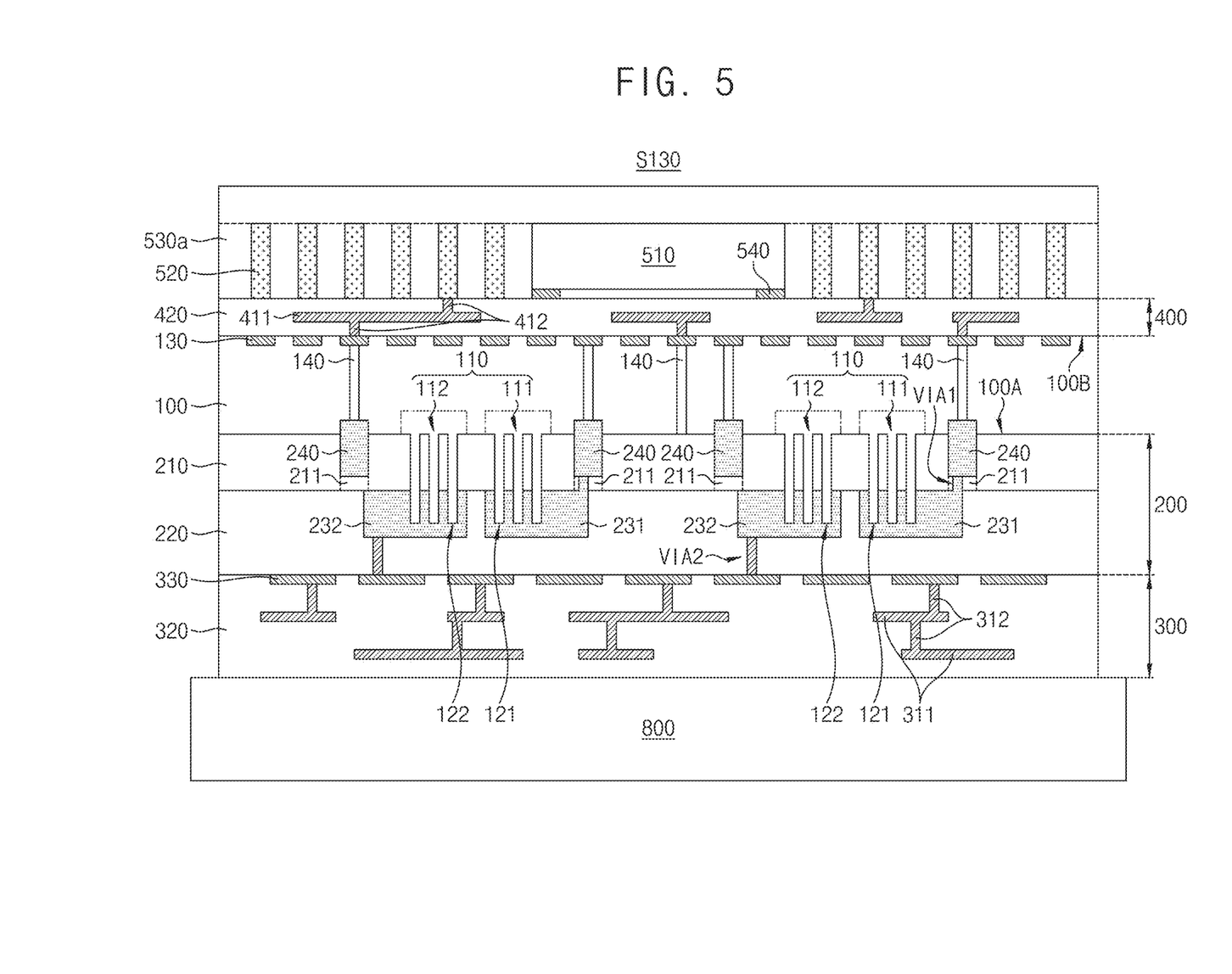
FIG. 5 is a third sectional view showing the method for manufacturing the integrated circuit chip in accordance with the example embodiment of the disclosure.

Subsequently, a molding material 530 may be formed such that the molding material 530 has a predetermined height while covering the charge storage member 510 and the metal posts 520 (cf. S130). In this case, the molding material 530 may be formed over the entire surface of the second BEOL structure 400, and may completely cover side and upper surfaces of the charge storage member 510 and the metal posts 520. In FIG. 5, the molding material 530 is designated by reference numeral "530a".

Figure 6:
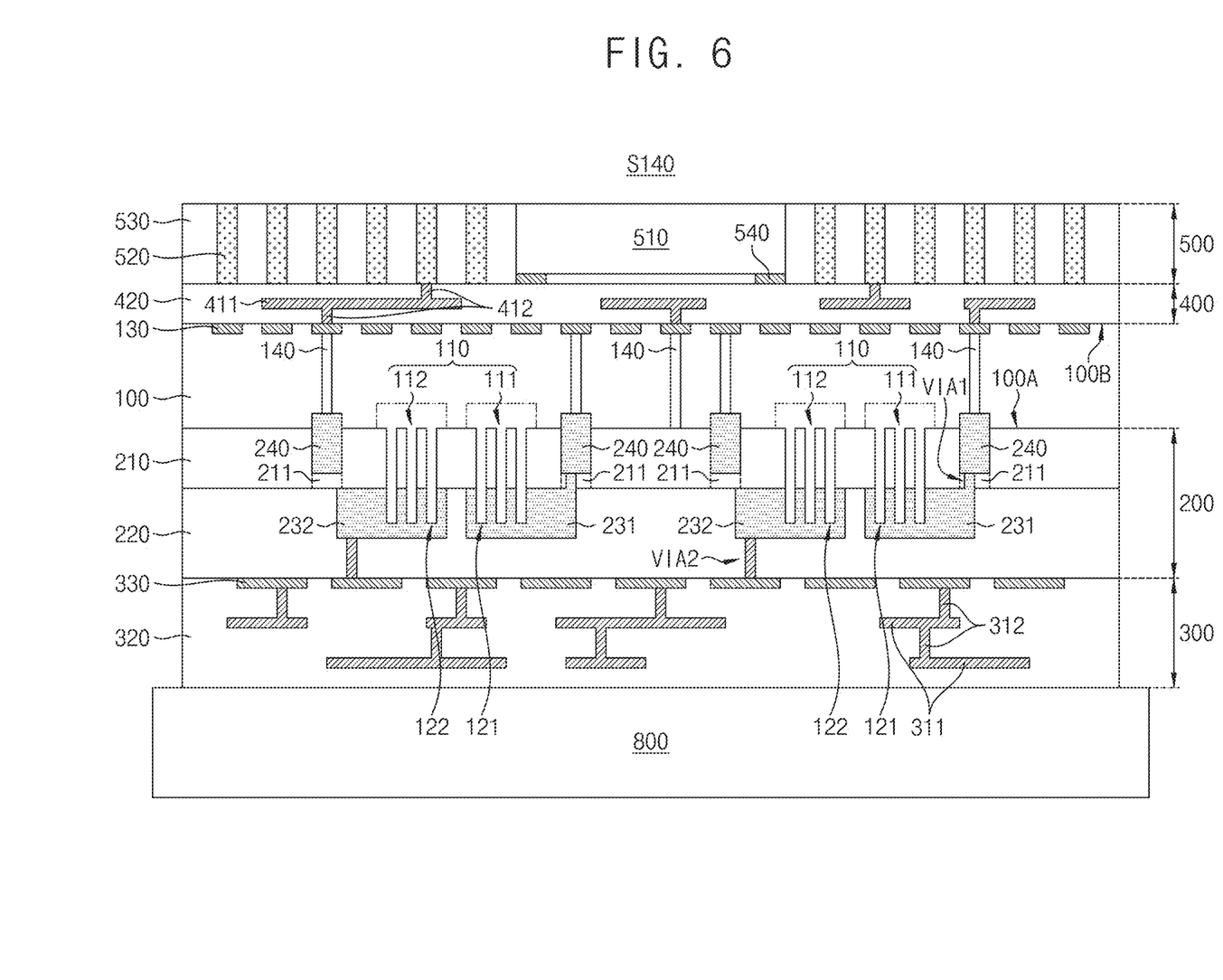
FIG. 6 is a fourth sectional view showing the method for manufacturing the integrated circuit chip in accordance with the example embodiment of the disclosure.

Thereafter, a grinding process may be performed in order to form, at the molding material 530, a flat surface for formation of a re-distribution structure layer 600 (cf. S140). In this case, for example, the grinding process may be chemical mechanical polishing (CMP). A portion of the molding material 530 may be removed to expose portions of the charge storage member 510 and the metal posts 520. In accordance with an embodiment, portions of the charge storage member 510 and the metal posts 520 may be removed through a CMP process.

Figure 7:
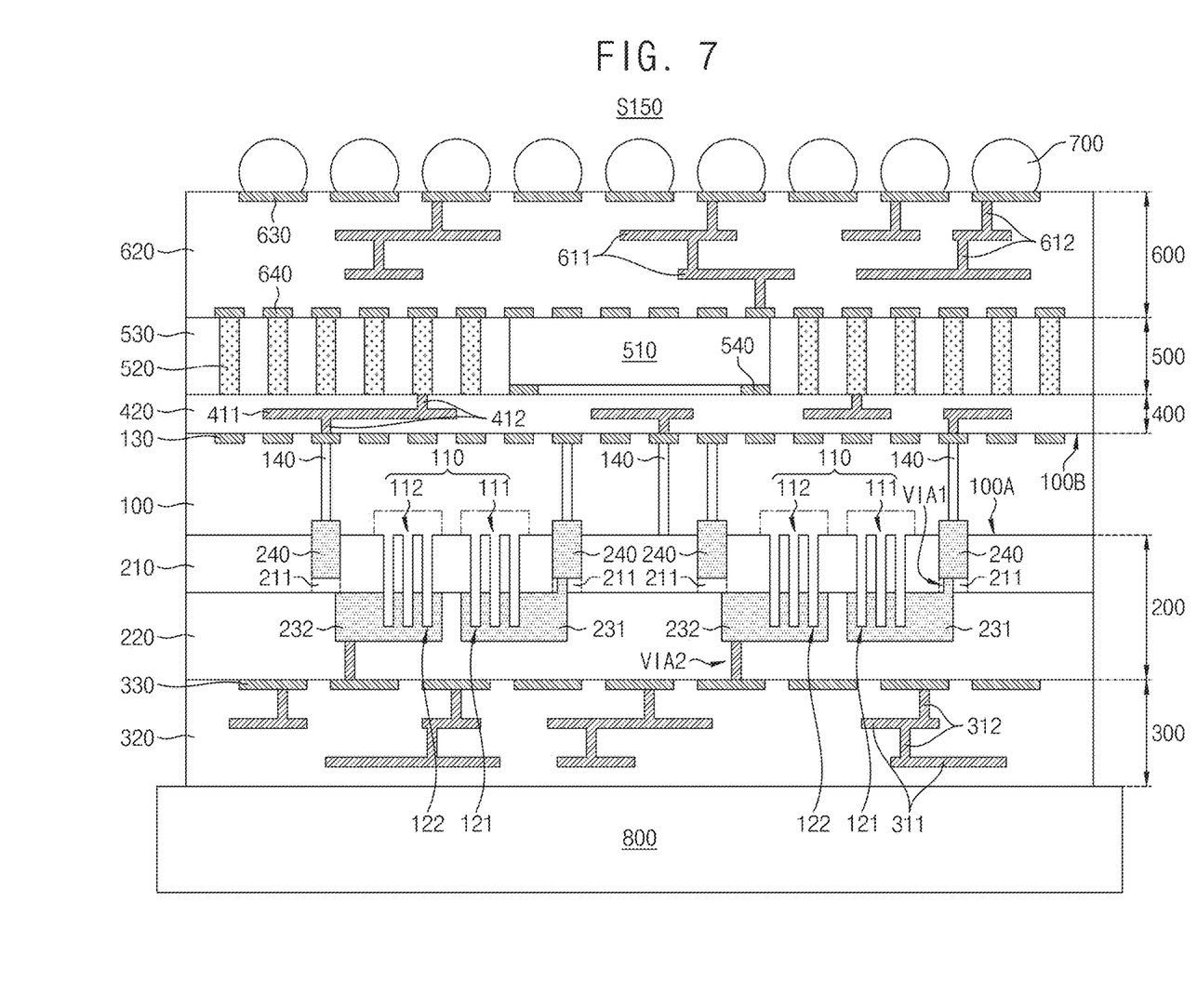
FIG. 7 is a fifth sectional view showing the method for manufacturing the integrated circuit chip in accordance with the example embodiment of the disclosure.

Thereafter, a re-distribution structure layer 600 and solder balls 700 may be formed on the flat surface of the molding material 530 (cf. S150).

Hereinafter, an integrated circuit chip according to another embodiment will be described. In the following description, repeated description of the same constituent elements as those in FIGS. 1 and 2 may be avoided, and these constituent elements are designated by reference numerals identical or similar to those of FIGS. 1 and 2.

Figure 8:
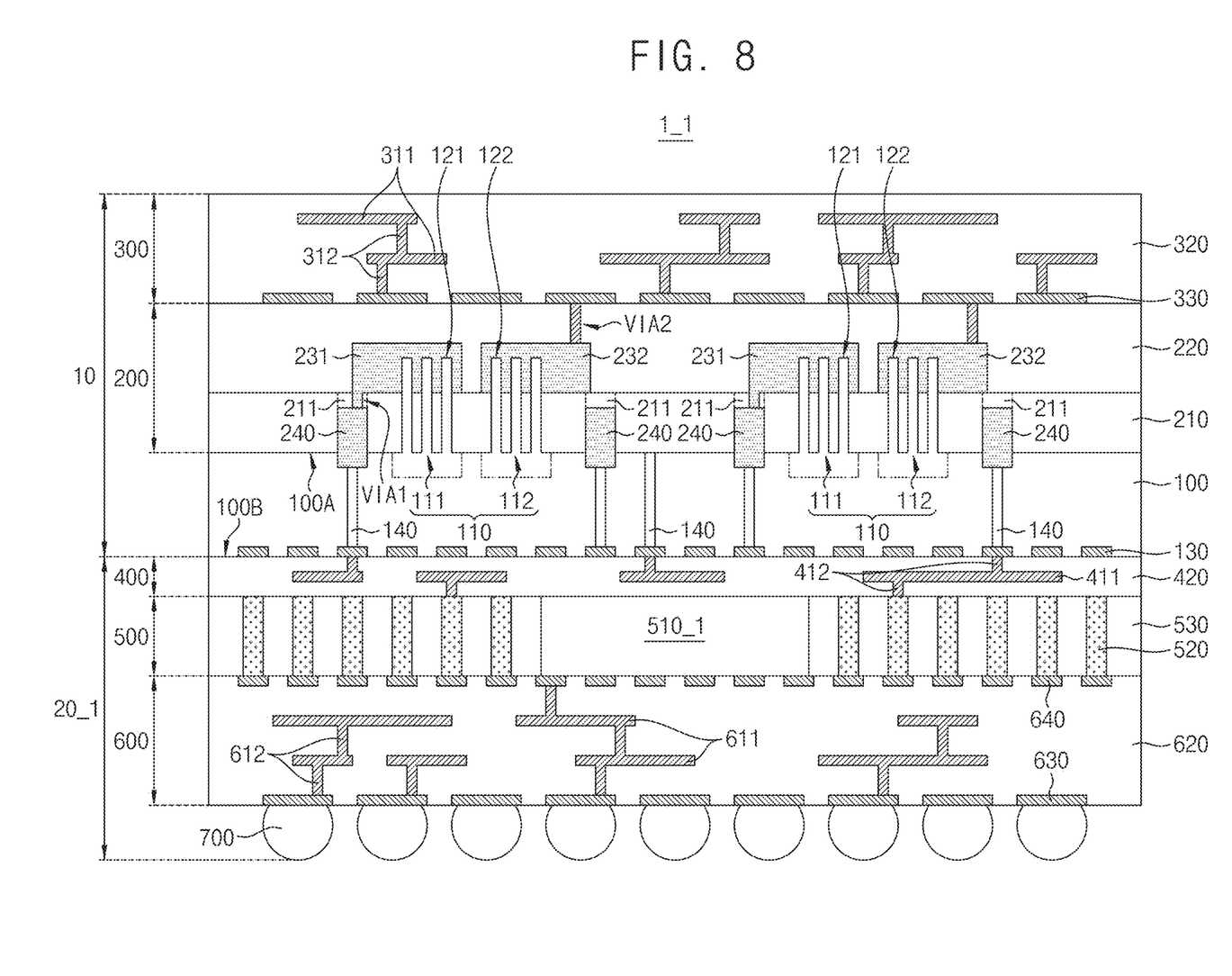
FIG. 8 is a sectional view of an integrated circuit chip according to an example embodiment of the disclosure.

FIG. 8 is a sectional view of an integrated circuit chip according to an example embodiment of the disclosure.

Referring to FIG. 8, an integrated circuit chip 1_1 according to this embodiment differs from the integrated circuit chip 1 according to the embodiment of FIG. 1 in that a connection pad 540 is omitted from an intermediate connection layer 500 in a PDN 20_1.

In an embodiment, a charge storage member 510_1 may be formed under a second BEOL structure 400 through a die-to-wafer (D2 W) method. That is, the charge storage member 510_1 may contact the second BEOL structure 400.

In an embodiment, the height (thickness) of the charge storage member 510_1 may be equal to heights of metal posts 520.

Figure 9:
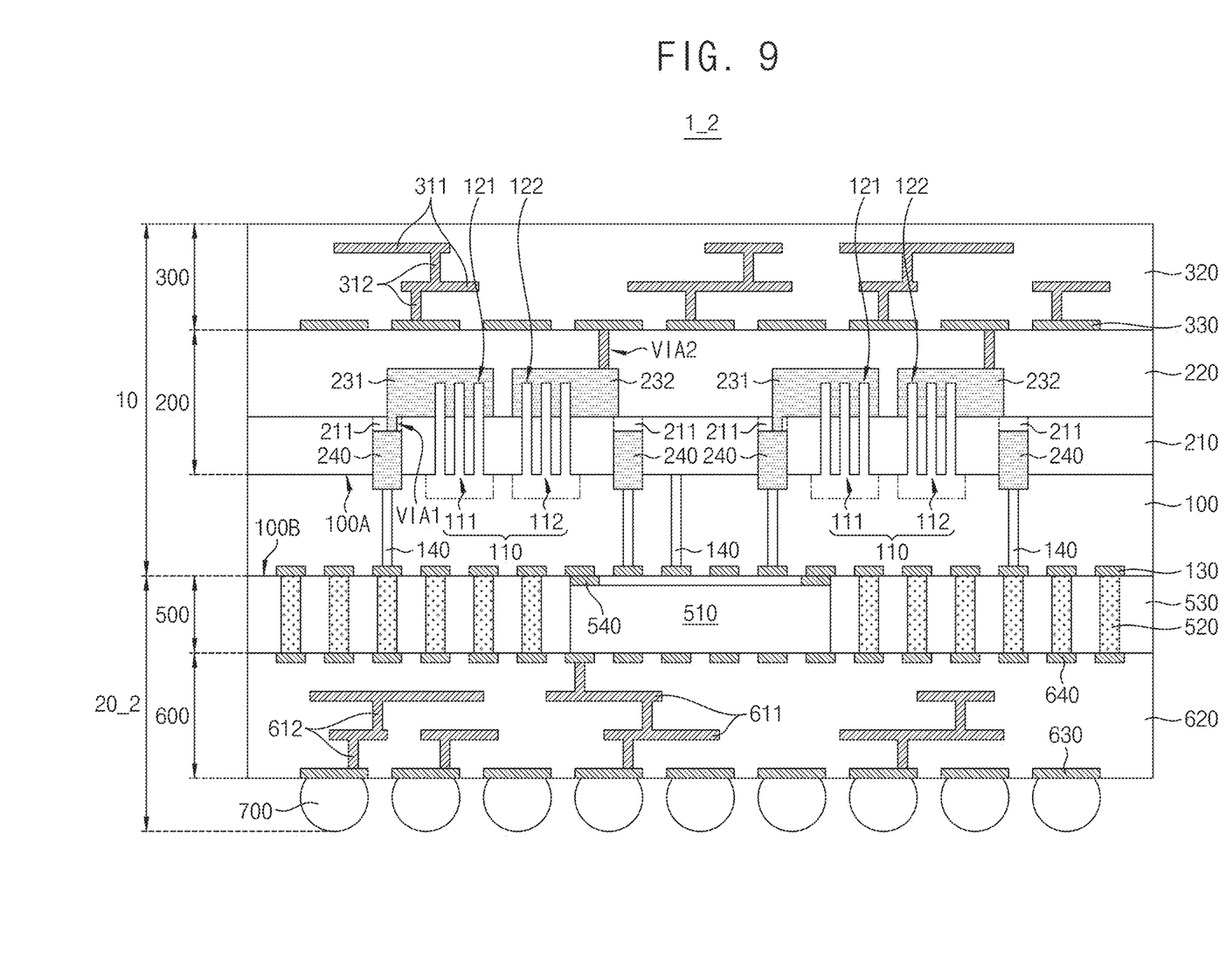
FIG. 9 is a sectional view of an integrated circuit chip according to an example embodiment of the disclosure.

FIG. 9 is a sectional view of an integrated circuit chip according to an example embodiment of the disclosure.

Referring to FIG. 9, an integrated circuit chip 1_2 according to this embodiment differs from the integrated circuit chip 1 according to the embodiment of FIG. 1 in that a second BEOL structure 400 is omitted from a PDN 20_2.

In an embodiment, an intermediate connection layer 500 may be directly disposed under a substrate 100. In an embodiment, each metal post 520 may contact a corresponding one of substrate pads 130 at one end thereof while contacting a corresponding one of first re-distribution pads 640 of a re-distribution structure layer 600 at the other end thereof.

Figure 10:
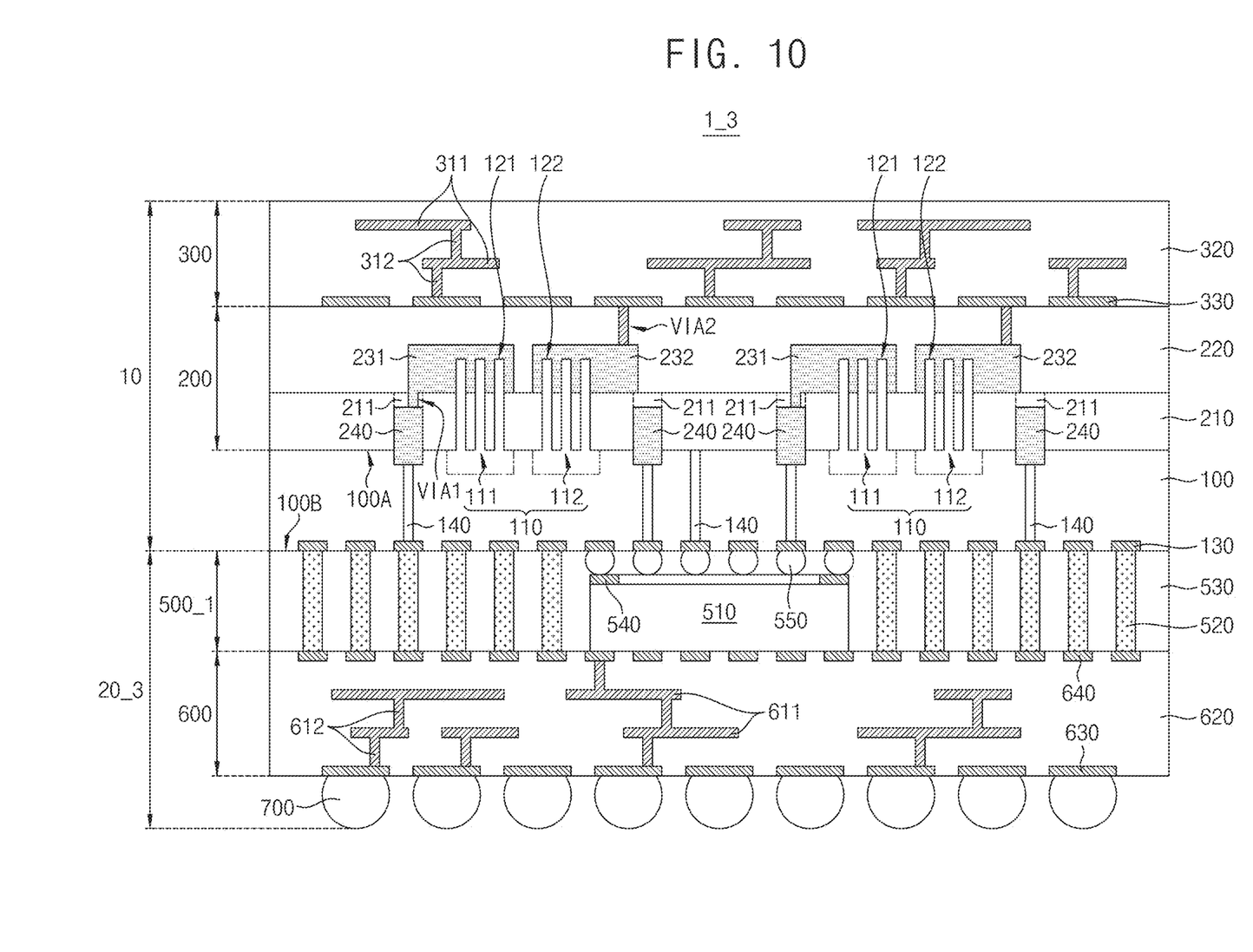
FIG. 10 is a sectional view of an integrated circuit chip according to an example embodiment of the disclosure.

FIG. 10 is a sectional view of an integrated circuit chip according to an example embodiment of the disclosure.

Referring to FIG. 10, an integrated circuit chip 1_3 according to this embodiment differs from the integrated circuit chip 1_2 according to the embodiment of FIG. 9 in that an intermediate connection layer 500_1 in a PDN 20_3 further includes bumps 550.

In an embodiment, the intermediate connection layer 500_1 may further include the bumps 550 which are disposed on a charge storage member 510. In some embodiments, a part of the bumps 550 may be directly disposed on connection pads, whereas the other part of the bumps 550 may be disposed on the charge storage member 510 under the condition that an insulating film is interposed between the bumps 550 and the charge storage member 510. Of course, the bumps 550 are not limited to the above-described conditions. In some other embodiments, a part of the bumps 550 may be directly disposed on the charge storage member 510. The charge storage member 510 may be formed under a substrate 100 through a chip-to-wafer (C2W) method.

The bumps 550 may be directly disposed under a back surface 100B of the substrate 100. The bumps 550 may electrically connect the charge storage member 510 to substrate pads 130. Each metal post 520 may contact a corresponding one of the substrate pads 130 at one end thereof while contacting a corresponding one of first re-distribution pads 640 of a re-distribution structure layer 600 at the other end thereof.

Figure 11:
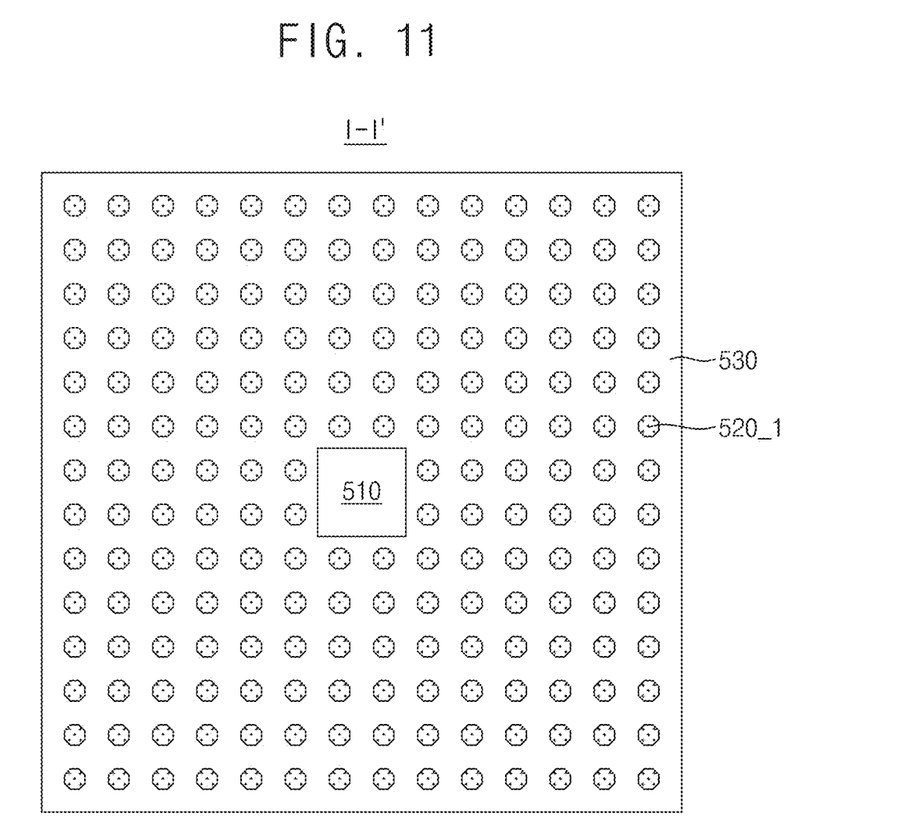
FIG. 11 is a plan view of an integrated circuit chip according to an example embodiment of the disclosure, which shows a modified embodiment of FIG. 2.

FIG. 11 is a plan view of an integrated circuit chip 1-1' according to an example embodiment of the disclosure, which shows a modified embodiment of FIG. 2.

Referring to FIG. 11, metal posts 520_1 according to this embodiment differ from the metal posts 520 of FIG. 2 in that the metal posts 520_1 have an octagonal column shape. In an embodiment, the cross-section of each metal post 520_1 may have an octagonal shape.

In accordance with example embodiments of the disclosure, an integrated circuit chip may be inexpensively manufactured while securing power integrity (PI) characteristics.

While example embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:
1. An integrated circuit chip comprising:
a substrate having an active surface and a back surface opposite to the active surface;
a front-end-of-line (FEOL) structure disposed on the active surface of the substrate;
a first back-end-of-line (BEOL) structure disposed on the FEOL structure;

an intermediate connection layer disposed under the back surface of the substrate, the intermediate connection layer comprising a charge storage, and metal posts disposed around the charge storage; and a re-distribution structure layer disposed under the intermediate connection layer, wherein a top surface of the charge storage, that faces towards the substrate, is a part of a top surface of the intermediate connection layer, or the top surface of the charge storage is directly connected to a connection pad within the intermediate connection layer.

2. The integrated circuit chip according to claim 1, wherein the intermediate connection layer further comprises a molding material covering surfaces of the charge storage and the metal posts.

3. The integrated circuit chip according to claim 2, wherein the molding material comprises an epoxy molding compound.

4. The integrated circuit chip according to claim 1, wherein a height of the charge storage is smaller than a height of each of the metal posts.

5. The integrated circuit chip according to claim 1, wherein:
the charge storage comprises silicon (Si); and
the metal posts comprise copper (Cu).

6. The integrated circuit chip according to claim 1, wherein the charge storage has a charge storage capacity of 200 to 400 nF/mm$^2$.

7. The integrated circuit chip according to claim 1, wherein the metal posts have a pitch of 100 to 120 μm.

8. The integrated circuit chip according to claim 1, wherein each of the metal posts has a height of 10 to 20 μm.

9. The integrated circuit chip according to claim 1, wherein each of the metal posts has a cylindrical shape.

10. The integrated circuit chip according to claim 1, wherein the metal posts in the intermediate connection layer are 6,000 or more in number.

11. The integrated circuit chip according to claim 1, wherein the top surface of the charge storage is directly connected to the connection pad within the intermediate connection layer.

12. The integrated circuit chip according to claim 1, further comprising:
a second BEOL structure disposed between the substrate and the intermediate connection layer,
wherein a thickness of the second BEOL structure is smaller than a thickness of the first BEOL structure.

13. The integrated circuit chip according to claim 12, wherein:
the first BEOL structure comprises wiring layers that extend in a horizontal direction and are separated from each other in a vertical direction, and the first BEOL structure further comprises at least one contact plug that connects together neighboring ones of the wiring layers; and
the second BEOL structure comprises a single-layer wiring that extends in the horizontal direction.

14. The integrated circuit chip according to claim 1, wherein:
the FEOL structure comprises a fin field effect transistor (FinFET); and
the FinFET comprises:
a channel region extending from the substrate in a vertical direction, and
a source region and a drain region which contact an upper portion of the channel region.

15. The integrated circuit chip according to claim 1, wherein the substrate and the intermediate connection layer directly contact each other.

16. The integrated circuit chip according to claim 1, further comprising:
bumps disposed between the substrate and the charge storage.

17. An integrated circuit chip comprising:
a logic chip; and
a power distribution network (PDN) disposed under the logic chip,
wherein the logic chip comprises:
a substrate having an active surface and a back surface opposite to the active surface,
a front-end-of-line (FEOL) structure disposed on the active surface of the substrate and comprising a lower insulating film comprising an oxide, the FEOL structure constituting a logic cell comprising a fin field effect transistor (FinFET), and
a first back-end-of-line (BEOL) structure disposed on the FEOL structure, and
wherein the PDN comprises:
a second BEOL structure disposed under the substrate and having a smaller thickness than the first BEOL structure,
an intermediate connection layer disposed under the second BEOL structure, the intermediate connection layer comprising a charge storage, copper (Cu) posts disposed around the charge storage, and a molding material covering side surfaces of the charge storage and the copper posts, the charge storage comprising SI,
a re-distribution structure layer disposed under the intermediate connection layer, and
solder balls disposed under the re-distribution structure layer,
wherein a top surface of the charge storage, that faces towards the second BEOL structure, is a part of a top surface of the intermediate connection layer, or the top surface of the charge storage is directly connected to a connection pad within the intermediate connection layer.

18. An integrated circuit chip comprising:
a logic chip comprising a substrate and a fin field effect transistor (FinFET) on one surface of the substrate; and
a power distribution network (PDN) disposed under the logic chip,
wherein the PDN comprises:
a back-end-of-line (BEOL) structure disposed under the substrate,
an intermediate connection layer disposed under the BEOL structure, the intermediate connection layer comprising a charge storage, copper (Cu) posts disposed around the charge storage, and a molding material covering side surfaces of the charge storage and the copper posts, the charge storage comprising Si, and
a re-distribution structure layer disposed under the intermediate connection layer, and
wherein a top surface of the charge storage, that faces towards the BEOL structure, is a part of a top surface of the intermediate connection layer, or the top surface of the charge storage is directly connected to a connection pad within the intermediate connection layer.

19. The integrated circuit chip according to claim 18, wherein a length of one side of the charge storage is 5 to 20% of a length of one side of the molding material when viewed in a plane.

20. The integrated circuit chip according to claim 18, wherein a height of the charge storage is equal to a height of each of the copper posts.

* * * * *